United States Patent
Son et al.

(10) Patent No.: US 7,501,188 B2
(45) Date of Patent: Mar. 10, 2009

(54) ORGANIC ELECTROLUMINESCENT DEVICE

(75) Inventors: Hae-Jung Son, Seoul (KR); Tae-Yong Noh, Gunpo-si (KR); Sang-Hoon Park, Seongnam-si (KR); Lyong-Sun Pu, Suwon-si (KR); Das Rupasree Ragini, Suwon-si (KR); Jong-Hyoup Lee, Seoul (KR); Eun-Sil Han, Yongin-si (KR); Young-Hun Byun, Yongin-si (KR); Seok Chang, Daejeon-si (KR); Yi-Yeol Lyu, Yongin-si (KR)

(73) Assignee: Sansung SDI Co., Ltd., Suwon-si, Gyeonggi-do (KR)

( * ) Notice: Subject to any disclaimer, the term of this patent is extended or adjusted under 35 U.S.C. 154(b) by 616 days.

(21) Appl. No.: 11/051,480

(22) Filed: Feb. 7, 2005

(65) Prior Publication Data

US 2005/0196638 A1    Sep. 8, 2005

(30) Foreign Application Priority Data

Feb. 11, 2004    (KR) .............. 10-2004-0008922

(51) Int. Cl.
    *H01L 51/50*    (2006.01)
(52) U.S. Cl. .............. 428/690; 428/917; 313/504; 313/506
(58) Field of Classification Search ............. 313/504, 313/506; 257/102, 103
    See application file for complete search history.

(56) References Cited

U.S. PATENT DOCUMENTS

| | | | |
|---|---|---|---|
| 5,621,131 A * | 4/1997 | Kreuder et al. | 558/46 |
| 6,863,997 B2 * | 3/2005 | Thompson et al. | 428/690 |
| 6,933,522 B2 * | 8/2005 | Lin et al. | 257/40 |
| 6,984,461 B2 * | 1/2006 | Son et al. | 428/690 |
| 7,288,617 B2 * | 10/2007 | Treacher et al. | 528/86 |
| 7,323,533 B2 * | 1/2008 | Becker et al. | 528/86 |
| 2002/0197511 A1 * | 12/2002 | D'Andrade et al. | 428/690 |
| 2003/0175553 A1 | 9/2003 | Thompson | |
| 2004/0046495 A1 * | 3/2004 | Peng | 313/504 |
| 2004/0066139 A1 | 4/2004 | Hamada et al. | |
| 2004/0124766 A1 * | 7/2004 | Nakagawa et al. | 313/504 |

FOREIGN PATENT DOCUMENTS

| | | |
|---|---|---|
| CN | 1449640 | 10/2003 |
| CN | 1498044 | 5/2004 |
| WO | WO 02/02714 | 1/2002 |
| WO | WO 02/077060 | * 10/2002 |

OTHER PUBLICATIONS

Nature, (2003), 421(6925), p. 829-833.*
Office Action from the Chinese Patent Office issued in Applicant's corresponding Chinese Patent Application No. 2005100565686 dated Apr. 25, 2008.

* cited by examiner

*Primary Examiner*—Dawn Garrett
(74) *Attorney, Agent, or Firm*—Robert E. Bushnell, Esq.

(57) ABSTRACT

An organic electroluminescent device having an emission layer, which is constructed with a host, a phosphorescence emission molecule as a dopant, and a fluorescence supporter. The fluorescence supporter receives energy from the host or traps energy directly, and then transfers the energy to the dopant or self-emits light. An emission spectrum of the fluorescence supporter and an absorption spectrum of the phosphorescence emission molecule overlap partly or completely. The organic electroluminescent device has improved luminous efficiency and color purity characteristics in comparison with a conventional organic electroluminescent device having an emission layer, which is composed of a phosphorescent dopant and a host. This system is useful in the manufacture of, in particular, blue emission devices.

19 Claims, 3 Drawing Sheets

PHOSPHORESCENCE MECHANISM

PHOSPHORESCENCE(max 100%)

ORGANIC ELECTROLUMINESCENT DEVICE

CLAIM OF PRIORITY

This application claims the priority of Korean Patent Application No. 10-2004-0008922, filed on Feb. 11, 2004, in the Korean Intellectual Property Office, the disclosure of which is incorporated herein in its entirety by reference.

BACKGROUND OF THE INVENTION

1. Field of the Invention

The present invention relates to an organic electroluminescent device, and more particularly, to an organic electroluminescent device of which a luminous efficiency is improved by using an additional fluorescent material.

2. Description of the Related Art

A general organic electroluminescent device includes an anode, a hole-transport layer, an emission layer, an electron transport layer and a cathode, sequentially formed on a substrate. The hole-transport layer, the emission layer, and the electron transport layer are organic layers.

An organic electroluminescent device having the above-described configuration is driven as follows. When a voltage is applied between the anode and the cathode, holes injected from the anode migrate to the emission layer via the hole-transport layer. Electrons emitted from the cathode migrate into the emission layer via the electron transport layer. The electrons and the holes recombine in the emission layer to generate excitons. While the excitons decay radioactively, light corresponding to a band gap of the molecules is emitted.

Materials for forming the emission layer of the organic electoluminescent device are classified into a fluorescent material that uses singlet excitons and a phosphorescent material that uses triplet excitons, according to a light-emitting mechanism. An emission layer may be composed of the fluorescent material or the phosphorescent material itself, without a host. Alternatively, the fluorescent material or the phosphorescent material is doped to an appropriate host material to form an emission layer. As a result of electron excitation, singlet excitons and triplet excitons are produced in the host. The singlet excitons and the triplet excitons in an organic electroluminescent device are created in a ratio of about 1:3.

Conventional organic electroluminescent devices using a fluorescent material as a material composing an emission layer are disadvantageous in that triplets are wasted from the host. However, conventional organic electroluminescent devices using a phosphorescent material as a material composing an emission layer are advantageous in that singlet excitons and triplet excitons are both utilized to achieve 100% internal quantum efficiency. Thus, an organic electroluminescent device using a phosphorescent material as a material composing an emission layer has high luminous efficiency compared with an organic electroluminescent device using a fluorescent material.

However, when the phosphorescent material is used as an emissive material, many problems arise. For example, an emission site is likely to be saturated because an emission lifespan is long when excitons are transferred from a triplet state to a ground state, and a triplet-triplet extinction occurs easily when an emission layer contains a high doping concentration or when a high current is applied. Accordingly, the doping concentration of the phosphorescent material in the emission layer is required to be maintained, in general, at 10% by weight or less.

SUMMARY OF THE INVENTION

It is therefore an object of the present invention to provide an improved organic electroluminescent device.

It is further an object of the present invention to provide an organic electroluminescent device including a phosphorescent material with improved luminous efficiency and color purity.

The above and other objects can be achieved by the present invention.

According to an aspect of the present invention, there is provided an organic electroluminescent device including an emission layer formed between a pair of electrodes, the emission layer including: a host; a phosphorescence emission molecule as a dopant; and an additional fluorescence supporter, which receives energy from the host or traps energy directly, and then transfers the energy to the phosphorescence emission molecule or self-emits light.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

In an organic electroluminescent device, an emission layer includes a host, a phosphorescence emission molecule as a dopant, and an additional fluorescence supporter assisting the phosphorescence emission molecule. The fluorescence supporter receives energy from the host or traps energy directly. Then, the energy is transferred to the dopant, or the fluorescence supporter self-emits light.

Figure 1A:
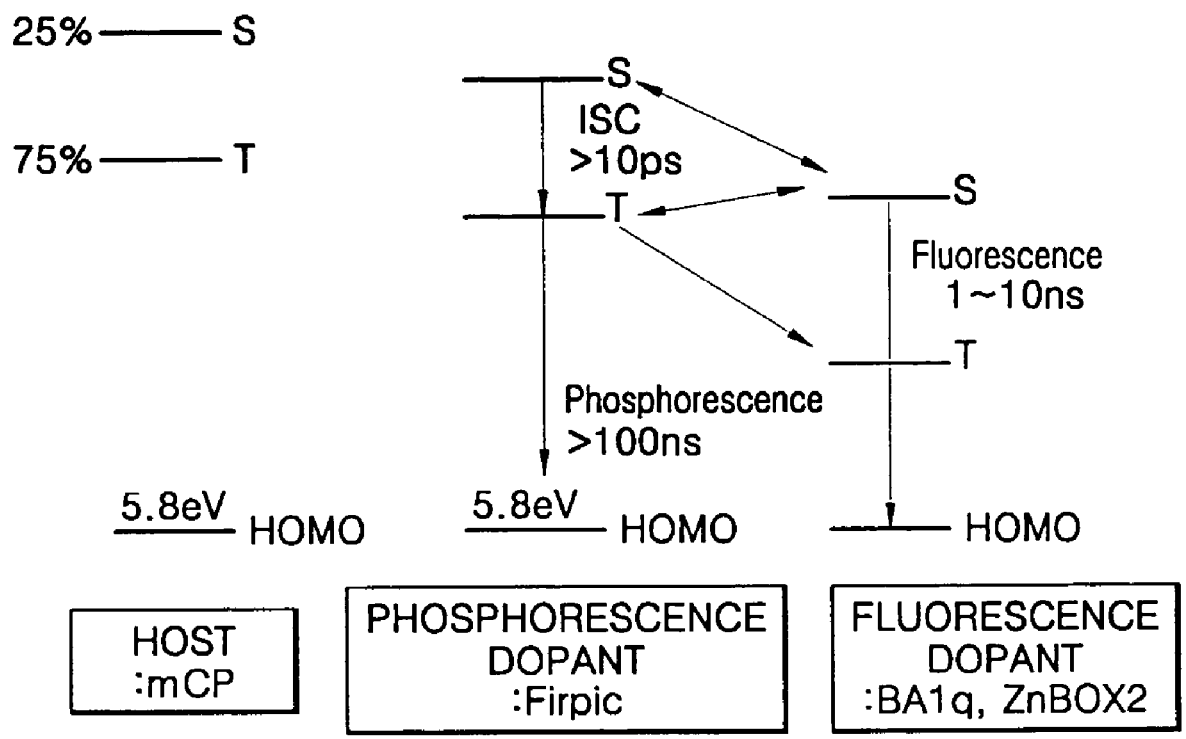
FIG. 1A is a view illustrating phosphorescence-fluorescence hybrid mechanism in an organic electroluminescent device according to an embodiment of the present invention.

An energy band gap between a ground state and a singlet state of the supporter is equal to or greater than an energy band gap between a ground state and a triplet state of the phosphorescence emission molecule (refer to FIG. 1A). The energy band gap between a ground state and a singlet state of the supporter may be preferably in the range of 2.0 eV to 3.5 eV, and the energy band gap between a ground state and a triplet state of the phosphorescence emission molecule may be preferably in the range of 1.9 eV to 3.0 eV.

In addition, the emission spectrum of the supporter overlaps completely or partly the absorption spectrum of the phosphorescence emission molecule.

The phosphorescence emission molecule traps energy directly, or receives energy from the host or the supporter. The emission peak of the supporter may appear in a 350 to 650 nm region, and the absorption peak of the phosphorescence emission molecule may appear in a 200 to 700 nm region.

Figure 1B:
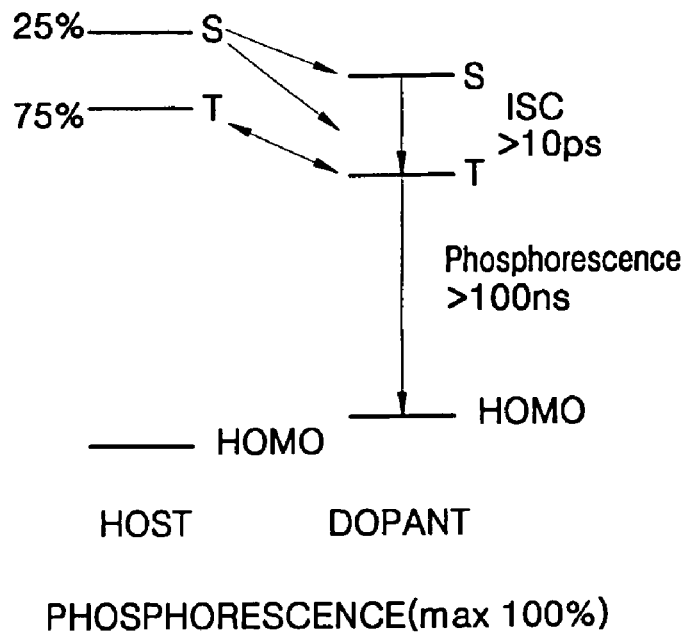
FIG. 1B is a view illustrating conventional phosphorescence emission mechanism.

FIG. 1A is a view illustrating phosphorescence-fluorescence hybrid mechanism in an organic electroluminescent device according to an embodiment of the present invention. FIG. 1B is a view illustrating conventional phosphorescence emission mechanism.

With reference to FIG. 1A and FIG. 1B, an energy transfer process among the host, the phosphorescence dopant, and the fluorescence supporter of phosphorescence dopant will now be described in detail. A Forster transfer occurs between singlet levels of the host and the phosphorescence dopant, and a Dexter transfer occurs between triplet levels of the host and the phosphorescence dopant. The energy, which is transferred to the singlet state of the phosphorescence dopant, undergoes a rapid intersystem crossing (ISC) process, thereby triplet-state of phosphorescence dopant emits light. The fluorescence supporter for phosphorescence dopant receives some of the energy possessed by host or traps energy directly. Then the energy is again transferred to the triplet-state of phosphorescence dopant, or the fluorescence supporter for phosphorescence dopant itself emits light. During this process, the energy transfer between the singlets of the host and the fluorescence supporter for phosphorescence dopant, and between the triplet of phosphorescent dopant and the singlet of the fluorescence supporter for phosphorescence dopant, can be explained according to Forster mechanism.

The presence of a fluorescent material in an emission layer can limit the saturation levels of the phosphorescence dopant triplet and the triplet-triplet quenching to some extent, because the fluorescent material can further contain excess energy. In addition, increased luminous efficiency can be obtained by the use of the emission of fluorescent material, which is the fluorescence supporter for phosphorescence dopant. On the contrary, in the conventional phosphorescent system (FIG. 1B), the decay time of the phosphorescent dopant is long enough that triplets can be easily saturated with excitons at a high current, which makes it more difficult to receive energy from the host. At this moment, the excess energy, which is not transferred to the dopant and exists in the triplet state of host, brings about the triplet-triplet quenching phenomenon, possibly lowering luminous efficiency.

Specific examples of the fluorescence supporter according to the present invention include spiro homopolymer represented by Formula 1, BAlq represented by Formula 2a, and ZnBOX$_2${(Zinc bis-2-(o-hydroxyphenyl)benzoxazolate)} represented by Formula 2b, a compound represented by Formula 2c, and the like.

[Formula 1]

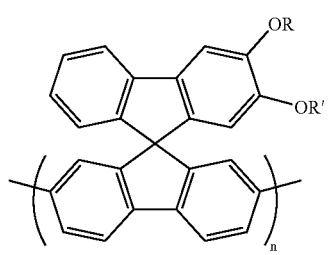

wherein n denotes the degree of polymerization and is a real number of 2 to 1,000, and R and R' are independently a C$_{1-20}$ alkyl group.

[Formula 2a]

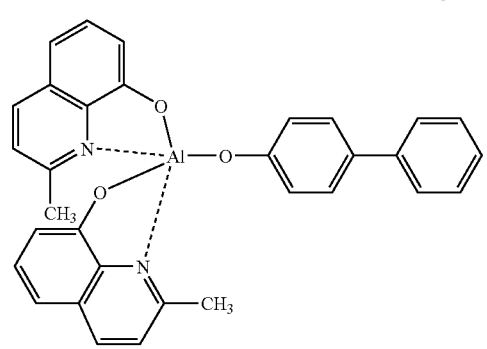

[Formula 2b]

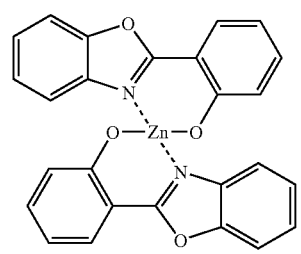

[Formula 2c]

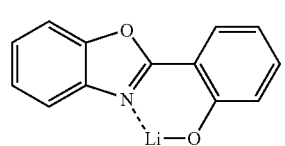

Specific examples of the spiro homopolymer represented by Formula 1 include a compound represented by Formula 3.

[Formula 3]

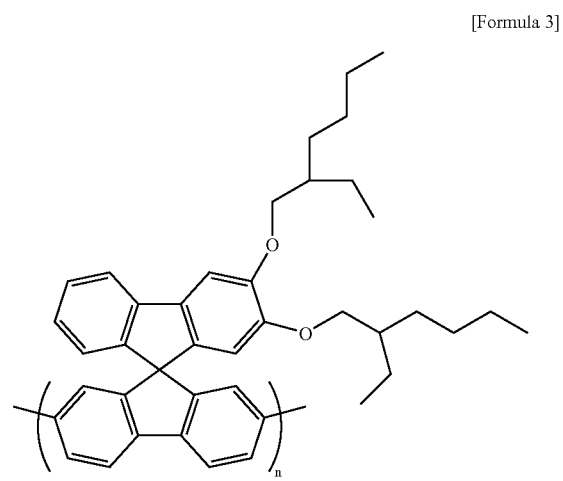

wherein n denotes the degree of polymerisation and is a real number of 2 to 1,000.

The amount of the fluorescence supporter may be in the range of 0.5 to 50 parts by weight based on the total weight 100 parts by weight of the host. If the amount of the supporter is less than 0.5 parts by weight, the supporter has almost no effect. If the amount of the supporter is greater than 50 parts by weight, an amount of the host becomes undesirably relatively small in comparison with that of the supporter.

A material for the host according to the present invention may be at least one selected from at least one polymer host, a mixture of a polymer host and a low molecular weight molecule host, a low molecular weight molecule host, and a non-luminous polymer matrix. As the polymer host, the low molecular weight molecule host and the non-luminous polymer matrix, any useful materials known in the art as materials for forming an emission layer of an organic electroluminescent device can be used. Typical examples of the polymer host include, but are not limited to, mCP(N,N'-dicarbazolyl-3,5-benzene), poly(vinylcarbazole) (PVK), polyfluorene and the like. Typical examples of the low molecular weight molecule host include, but are not limited to, CBP(4,4'-N,N'-dicarbazole-biphenyl), 4,4'-bis[9-(3,6-biphenylcarbazolyl)]-1-1,1'-biphenyl, 9,10-bis[(2',7'-t-butyl)-9',9"-spirobifluorenylanthracene, tetrafluorene and the like. Typical examples of the non-luminous polymer matrix include, but are not limited to, polymethylmethacrylate, polystyrene and the like.

Examples of the phosphorescence dopant according to the present invention include Firpic represented by Formula 4a, $Ir(F_2ppy)_3$ represented by Formula 4b, and the like.

[Formula 4a]

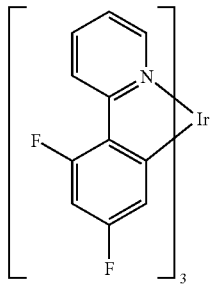

[Formula 4b]

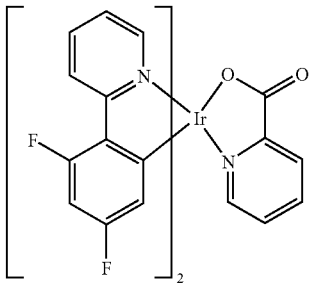

The amount of the phosphorescence dopant may be in the range of 0.5 to 20 parts by weight based on the total weight 100 parts by weight of the host. If the amount of the dopant is less than 0.5 parts by weight, the luminous efficiency decreases. If the amount of the dopant is greater than 20 parts by weight, the extinction phenomenon undesirably occurs in the dopant.

Hereinafter, a method of manufacturing an organic electroluminescent device according to an embodiment of the present invention will be described.

First, a patterned first electrode is formed on a substrate. Any substrate used in conventional organic electroluminescent devices can be utilized in the present invention, and preferably, a glass substrate and a transparent plastic substrate may be used. In this case, the substrate has excellent transparency and surface smoothness, can be easily managed, and is waterproofed. The thickness of the substrate may be in the range of 0.3-0.7 mm.

A first electrode forming material is a conductive material or oxides thereof, which may easily allow holes to be injected. Specific examples of the first electrode forming material include ITO (Indium Tin Oxide), IZO (Indium Zinc Oxide), Ni, Pt, Au, Ir, and the like.

The substrate on which the first electrode is formed is cleaned with an organic solvent, and then is exposed to UV/ozone treatment. Examples of the organic solvent include isopropanol (IPA), acetone, and the like.

After the first electrode is formed, a hole injection layer (HIL) is selectively formed thereon. The formation of the hole injection layer may result in a low contact resistance of a hole-transport layer and an enhanced hole transporting capability of the first electrode with respect to an emission layer. As a result, the driving voltage and the lifespan characteristics of the organic electroluminescent device can be improved. A material for forming the hole injection layer may be PEDOT{poly(3,4-ethylenedioxythiophene)}/PSS(polystyrene parasulfonate), starburst-based amines such as IDE 406 available from Idemitsu Kosan Co., Ltd., or the like. The material for forming the hole injection layer is coated on the first electrode and dried, therefore forming the hole injection layer.

A hole-transport layer is formed on the hole injection layer. Any material that is commonly used to form hole-transport layers can be used in the present invention. Examples of a material composing the hole-transport layer include N,N'-bis(3-methylphenyl)-N,N'-diphenyl-[1,1-biphenyl]-4,4'-diamine(TPD), N,N'-di(naphthanlene-1-yl)-N,N'-diphenyl benzidine, and the like. The hole-transport layer is formed by, but is not limited to, spin-coating or vacuum deposition. If the material composing the hole-transport layer is a low molecular weight molecule, the hole-transport layer is formed by vacuum deposition.

An emission layer (EML) is formed on the hole-transport layer. A light-emitting forming composition is prepared by dissolving a host material, a phosphorescence emission molecule and a supporter in an organic solvent. Any organic solvent that can dissolve the host material, the phosphorescence emission molecule and the supporter can be used in the present invention. Specific examples of the organic solvent include toluene, chlorobenzene, and the like. An amount of the organic solvent may be controlled so that the concentration of the solid materials, which include the host material, the phosphorescence emission molecule and the supporter, is in the range of 0.01 to 1M.

Methods useful in forming the emission layer include, but are not limited to, printing, spin-coating, and ink-jet printing. In particular, it is preferable that the emission layer is formed by spin coating and printing.

The thickness of the emission layer is in the range of 100 to 500 Å. If the thickness of the emission layer is less than 100 Å, the luminous efficiency decreases. If the thickness of the emission layer is larger than 500 Å, the driving voltage undesirably increases.

A hole blocking layer (HBL) is selectively formed on the emission layer. The hole blocking layer blocks exitons, which are generated from a luminous material, from migrating to an electron transport layer, or blocks holes from migrating to the electron transport layer. A material composing the hole blocking layer is phenanthrolines such as BCP (available from UDC Co.), imidazoles, triazoles, oxadiazoles such as PBD, aluminum complex such as BAlq represented by the following Formula (available from UDC Co.). Methods of forming the hole blocking layer include, but are not limited to, deposition or spin-coating depending on the material composing the hole blocking layer.

The electron transport layer (ETL) is formed on the hole blocking layer. A method of forming the ETL includes vacuum deposition and spin-coating depending on the material composing the ETL. A material composing the ETL is the compounds represented by Formula 5, oxazoles, isoxazoles, triozoles, isothiazoles, oxadiazoles, thiadiazoles, perylenes, aluminium complexes, or gallium complexes. Examples of aluminium complexes include $Alq_3$(tris(8-quinolinolato)-aluminium), BAlq, SAlq, $Almq_3$, and the like. Examples of gallium complexes include $Gaq'_2OPiv$, $Gaq'_2OAc$, $2(Gaq'_2)$, and the like.

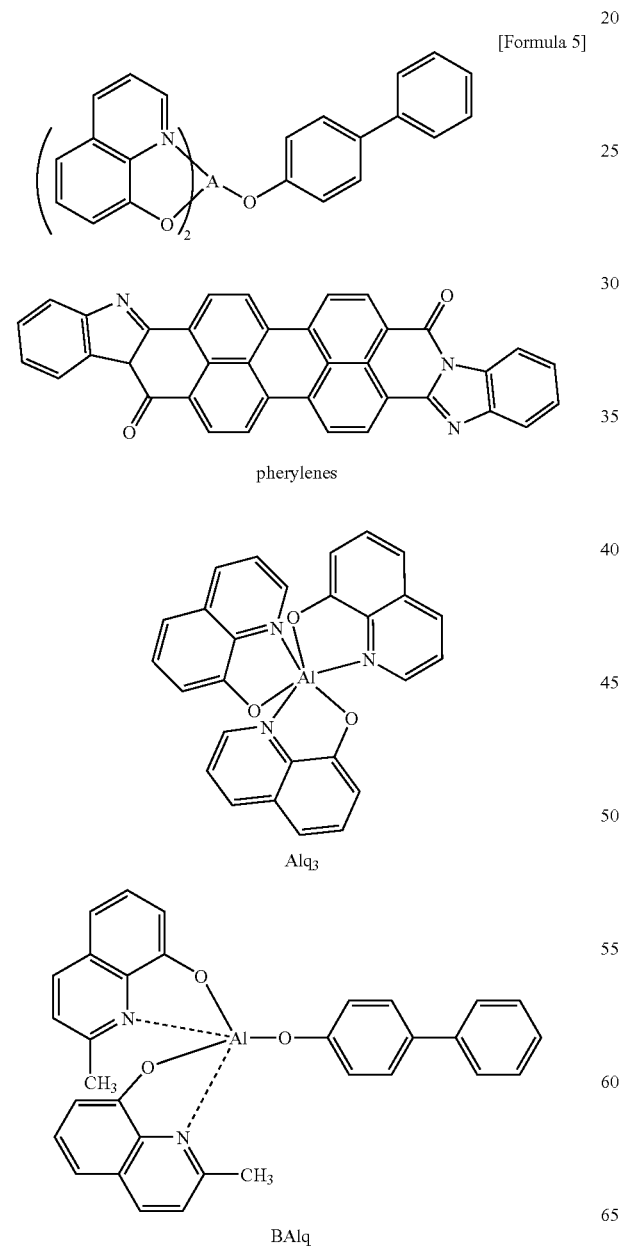

[Formula 5]

pherylenes

Alq3

BAlq

-continued

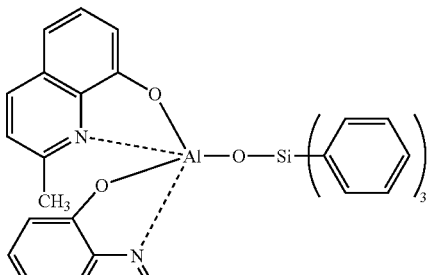

SAlq

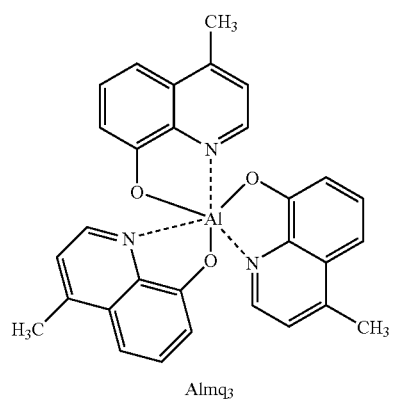

Almq3

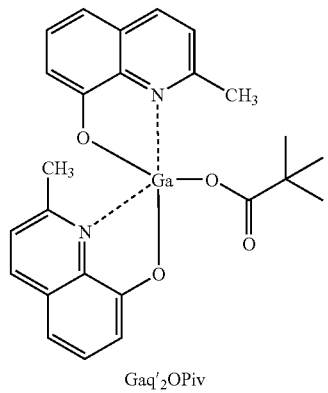

Gaq'2OPiv

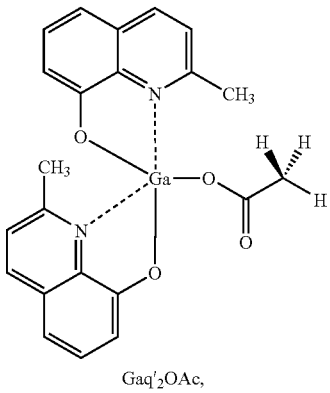

Gaq'2OAc,

-continued

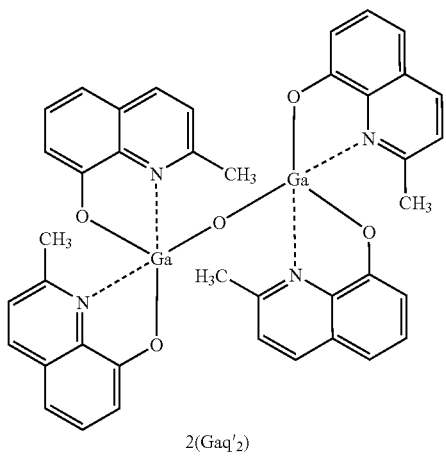

2(Gaq'$_2$)

An electron injection layer (EIL) is deposited on the electron transport layer. A material composing the EIL is Li, Ba, LiF, BaF$_2$, Ca, NaCl, CsF, or the like. A method of forming the EIL includes vacuum deposition. The thickness of the EIL may be in the range of 1 to 15 Å.

A second electrode is formed on the EIL, and the resultant layers are encapsulated to complete an organic electroluminescent device.

The second electrode is formed by depositing a small work function metal, such as Al, Mg, and a Mg alloy. The thickness of the second electrode may be in the range of 800 to 3,000 Å.

Figure 2:
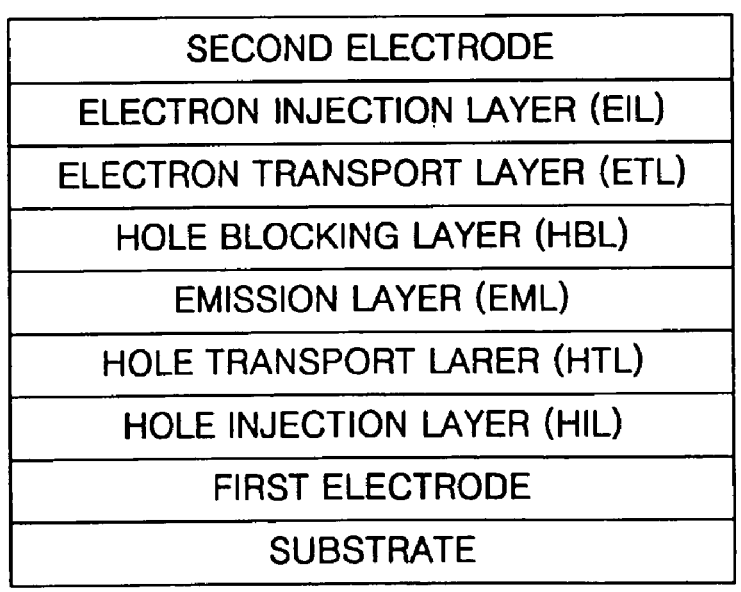
FIG. 2 is a sectional view illustrating a structure of an organic electroluminescent device manufactured according to an embodiment of the present invention.

An organic electroluminescent device according to the present invention may have a laminated structure illustrated in FIG. 2. However, if needed, one or two intermediate layers may be further formed therein. In addition, the hole blocking layer, the electron injection layer, and the like can be selectively formed, and, in some cases, such layers can be omitted.

Hereinafter, the present invention will now be described in more detail with reference to the following Examples. However, these examples are given for the purpose of illustration and not of limitation.

EXAMPLE 1

Manufacture of Organic Electoluminescent Device

A transparent electrode substrate was coated with indium-tin oxide(ITO) and cleaned to form a ITO layer. The ITO layer was patterned using a photoresist resin and etchant to form an ITO electrode pattern. The ITO electrode pattern was cleaned again. The cleaned resultant pattern was coated with PEDOT:PSS (available from Bayer Inc. in the trade name of Batron P 4083) to a thickness of about 500 Å, and baked at 100° C. for about 10 minutes to form a hole injection layer ("500" in FIG. 3).

A luminous material was prepared by mixing 100 parts by weight of poly-vinylcarbazole (PVK) as a host material, 6.6 parts by weight of Firpic represented by Formula 4 as a phosphorescent dopant, and 3.3 parts by weight of the spiro-homo polymer represented by Formula 2 as a supporter. 0.1 parts by weight of the luminous material, which is the mixture of poly-vinylcarbazole (PVK), Firpic, and the spiro-homo polymer, was dissolved in 10 mL chlorobenzen to prepare an emission layer forming composition (300). The hole injection layer was spin-coated with the emission layer forming composition (300), baked at 160° C. for one hour, and placed in a vacuum oven so that the solvent was completely evaporated to form an emission layer having a thickness of 300 Å.

A hole blocking layer-cum-ETL having a thickness of 400 Å was formed by deposition of BAlq (400) on the polymer emission layer in vacuum, while maintaining a vacuum at a maximum of 4×10$^{-6}$ torr. An EIL having a thickness of 10 Å was formed by depositing LiF (10) on the hole blocking layer-cum-ETL in a vacuum at a rate of 0.1 Å/sec. An anode having a thickness of 1,000 Å was formed by depositing Al (1000) on the electron injection layer at a rate of 10 Å/sec.

The resultant was encapsulated to complete an organic electroluminescent device. The encapsulating process included sealing the layers using a metal container in a Glove Box filled with BaO powder under a dry nitrogen atmosphere, and performing a final treatment using a UV hardener.

Figure 3:
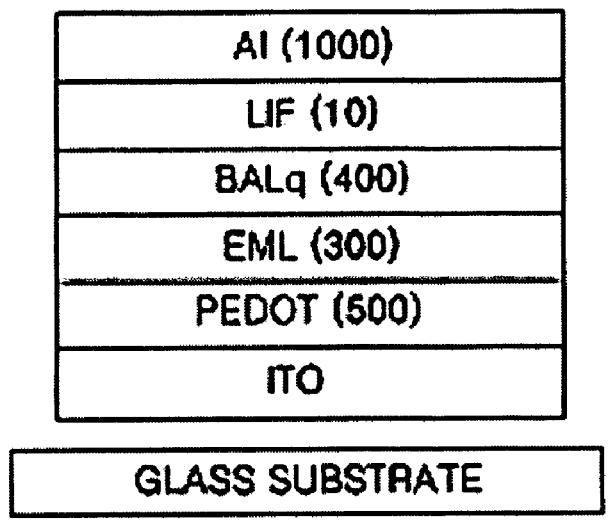
FIG. 3 is a sectional view illustrating a structure of an organic electroluminescent device according to Example 1 of the present invention.

The organic electroluminescent device was a multi-layered device, as shown in FIG. 3, and the luminous area was 9 mm$^2$.

COMPARATIVE EXAMPLE 1

Manufacture of Organic Electroluminescent Device

An organic electroluminescent device was manufactured in the same manner as in Example 1, except that a luminous material was prepared by mixing 100 parts by weight of PVK as a host material and 6.6 parts by weight of Firpic as a phosphorescent dopant, and 0.1 parts by weight of the luminous material was dissolved in 10 mL chlorobenzene to prepare an emission layer forming composition.

COMPARATIVE EXAMPLE 2

Manufacture of Organic Electroluminescent Device

An organic electroluminescent device was manufactured in the same manner as in Example 1, except that a luminous material was prepared by mixing 100 parts by weight of PVK as a host material and 6.6 parts by weight of the spiro-homo polymer as a supporter, and 0.1 parts by weight of the luminous material was dissolved in 10 mL chlorobenzene to prepare an emission layer forming composition.

Figure 4:
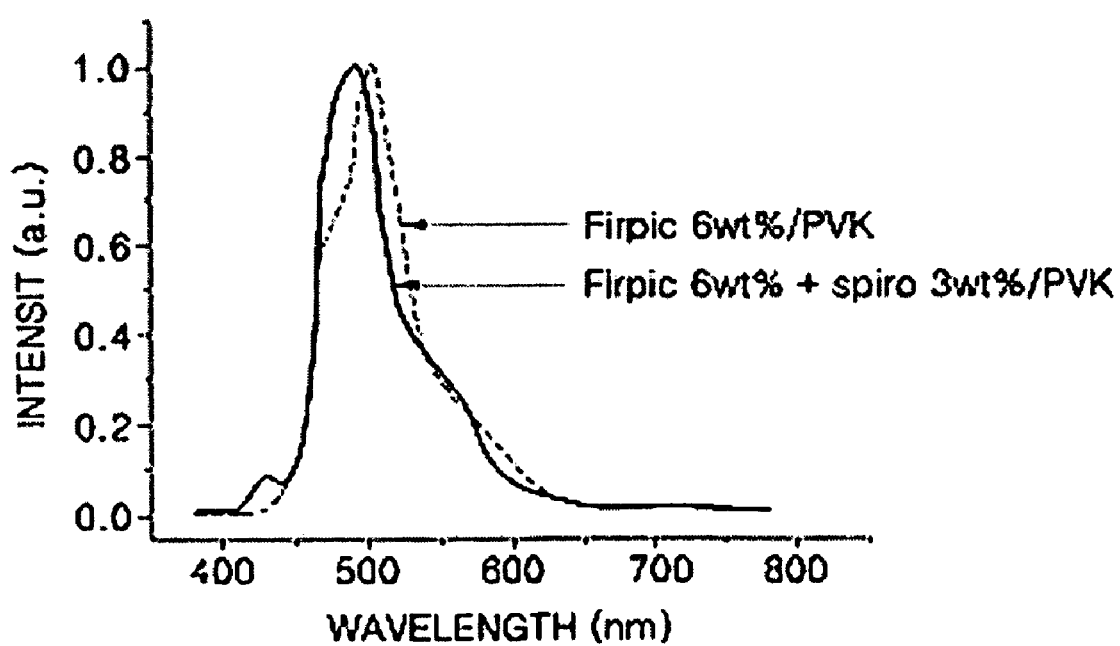
FIG. 4 is a view illustrating the photoluminescence (PL) spectra of organic electroluminescent devices manufactured according to Example 1 and Comparative Example 1 of the present invention.

Measured were color coordinate characteristics and electroluminescence characteristics of organic electroluminescent devices manufactured according to Example 1 and Comparative Examples 1 and 2. The results are shown in Table 1. FIG. 4 is the photoluminescence (PL) spectra of organic electroluminescent devices manufactured according to Example 1 and Comparative Example 1.

The EL characteristics were measured using forward-bias voltage, which is a direct voltage, as driving voltage. Here, SMU238 (available from Keithleythe Co.) was used to provide forward-bias voltage. The luminous characteristics, including brightness, spectrum and color coordinate, were measured using PR650 (purchased from Photo Research Inc.)

TABLE 1

| | Variable | Comparative | Example 1 | Comparative |
|---|---|---|---|---|
| @100 cd/m$^2$ | CIE(x,y) | (0.2014, 0.4278) | (0.1879, 0.3764) | (0.254, 0.348) |
| | Driving Voltage | 9.0 V | 8.5 V | 10.0 V |
| | Luminous efficiency (cd/A) | 4.95 cd/A | 6.01 cd/A | 1.34 cd/A |
| | Quantum Efficiency | 2.22% | 2.98% | 0.66% |
| | Power Efficiency (lm/W) | 1.73 | 2.22 | 0.42 |

By comparing the organic electroluminescent devices according to Example 1 and Comparative Example 1 as shown in Table 1, it is confirmed that there is an improvement in the external quantum efficiency, luminous efficiency, color purity characteristics, the driving voltage, and luminance in Example 1 in which the supporter is added to the emission layer. The organic electroluminescent emission characteristics of the organic electroluminescent device according to Comparative Example 2 shows that the improvement of the effects of the organic electroluminescent device according to Example 1 are caused by the structure of the emission layer according to the present invention and not by the addition of the phosphorescent supporter alone.

As described above, according to the present invention, an emission layer including a host and a phosphorescent dopant further includes a material, which can assist a phosphorescent material. An organic electroluminescent device using the emission layer according to the present invention has improved luminous efficiency and color purity characteristics, compared with a conventional organic electroluminescent device including a host and a phosphorescent dopant only. This system is useful in manufacturing, in particular, blue emission devices as above.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic electroluminescent device, comprising:
a pair of electrodes; and
an emission layer formed between the pair of electrodes, the emission layer comprising:
  a host;
  a phosphorescence emission molecule as a dopant; and
  a fluorescence supporter receiving energy from the host or trapping energy, the fluorescence support transferring the energy to the phosphorescence emission molecule or self-emitting light, an energy band gap between a ground state and a singlet state of the fluorescence supporter being equal to or greater than an energy band gap between a ground state and a triplet state of the phosphorescence emission molecule.

2. The organic electroluminescent device of claim 1, wherein the energy band gap between the ground state and the singlet state of the fluorescence supporter is in the range of 2.0 to 3.5 eV, and the energy band gap between the ground state and the triplet state of the phosphorescence emission molecule is in the range of 1.9 to 3.0 eV.

3. The organic electroluminescent device of claim 1, wherein an emission spectrum of the fluorescence supporter and an absorption spectrum of the phosphorescence emission molecule overlap.

4. The organic electroluminescent device of claim 3, wherein an emission peak of the fluorescence supporter is in a 350 to 650 nm region, and an absorption peak of the phosphorescence emission molecule is in a 200 to 700 nm region.

5. The organic electroluminescent device of claim 1, wherein the phosphorescence emission molecule traps energy or receives energy from the host or the fluorescence supporter.

6. The organic electroluminescent device of claim 1, wherein the amount of the phosphorescence emission molecule is in the range of 0.5 to 20 parts by weight based on the total weight 100 parts by weight of the host, and the amount of the fluorescence supporter is in the range of 0.5 to 50 parts by weight based on the total weight 100 parts by weight of the host.

7. The organic electroluminescent device of claim 1, wherein the fluorescence supporter is at least one selected from the group consisting of the spiro homopolymer represented by Formula 1, BAlq represented by Formula 2a, and ZnBOX$_2$(Zinc bis-2-(o-hydroxyphenyl) benzoxazolate) represented by Formula 2b, and a compound represented by Formula 2c:

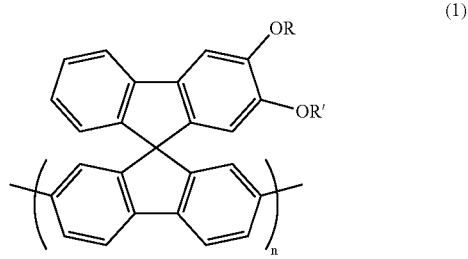

(1)

wherein n denotes the degree of polymerization and is a real number of 2 to 1,000, and R and R' are independently a C$_{1-20}$ alkyl group,

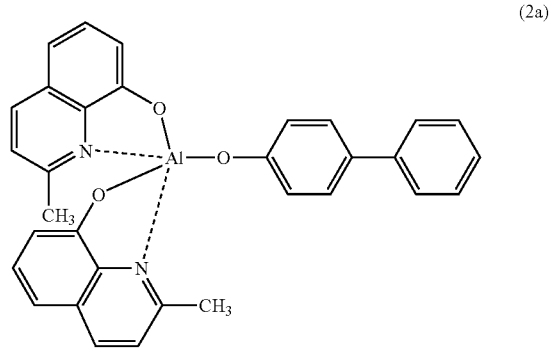

(2a)

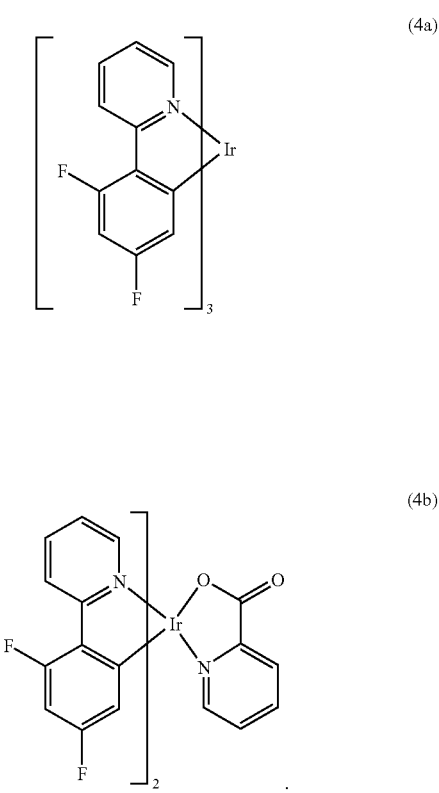

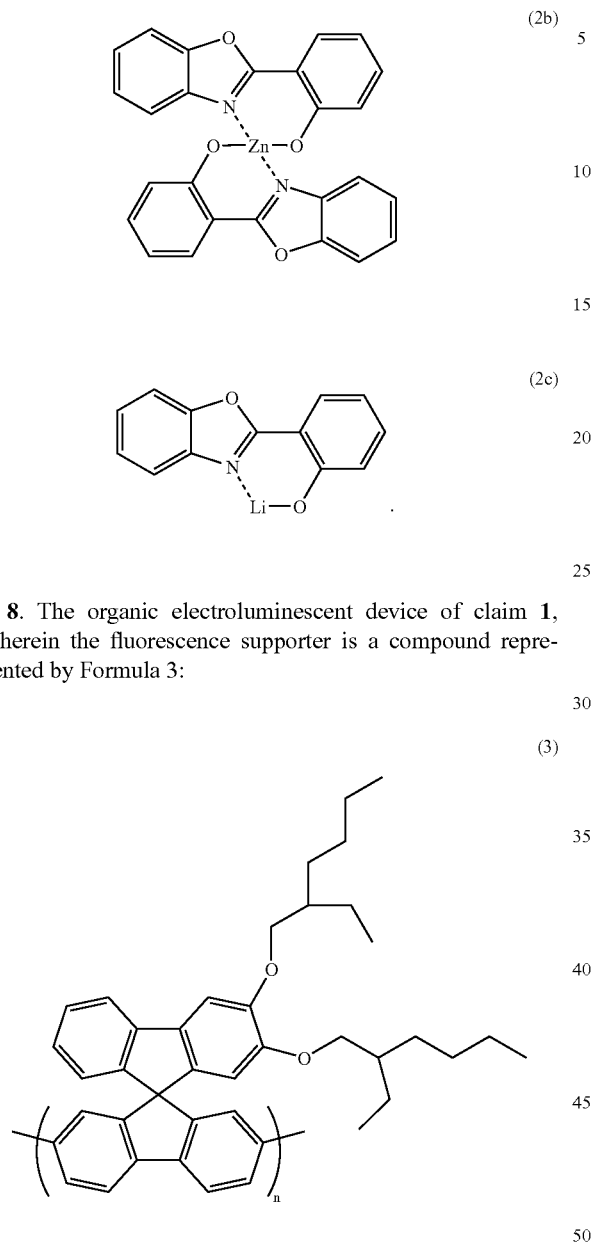

8. The organic electroluminescent device of claim 1, wherein the fluorescence supporter is a compound represented by Formula 3:

wherein n denotes the degree of polymerisation and is a real number of 2 to 1,000.

9. The organic electroluminescent device of claim 1, wherein the host comprises a compound selected from the group consisting of mCP(N,N'-dicarbazolyl-3,5-benzene), poly(vinylcarbazole) (PVK), polyfluorene, CBP(4,4'-N,N'-dicarbazole-biphenyl), 4,4'-bis[9-(3,6-biphenylcarbazolyl)]-1-1,1'-biphenyl, 9,10-bis[(2',7'-t-butyl)-9',9''-spirobifluorenylanthracene, tetrafluorene, polymethacrylate, and polystyrene.

10. The organic electroluminescent device of claim 1, wherein the phosphorescence emission molecule is selected from the group consisting of Firpic represented by Formula 4a, and Ir(F$_2$ppy)$_3$ represented by Formula 4b:

11. The organic electroluminescent device of claim 1, wherein the thickness of the emission layer is in the range of 100 to 500Å.

12. An organic electroluminescent device, comprising:
a pair of electrodes; and
an emission layer formed between the pair of electrodes, the emission layer comprising:
a host;
a fluorescence supporter comprising a compound selected from the group consisting of the compounds represented by Formulae 1, 2a, 2b and 2c:

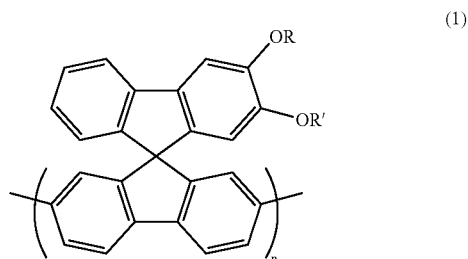

wherein n denotes the degree of polymerization and is a real number of 2 to 1,000, and R and R' are independently a C$_{1-20}$ alkyl group,

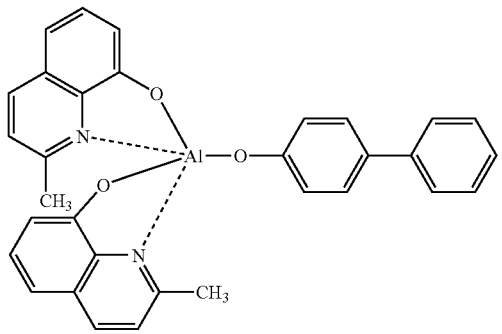
(2a)

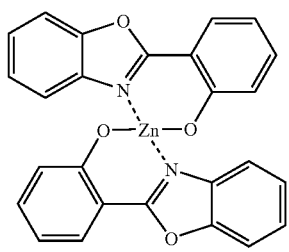
(2b)

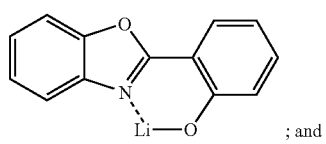
; and
(2c)

a phosphorescence emission molecule, the phosphorescence emission molecule comprising a compound selected from the group consisting of compounds represented by Formulae 4a and 4b:

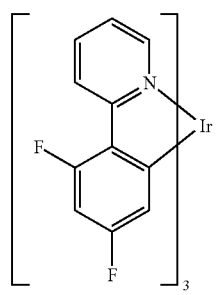
(4a)

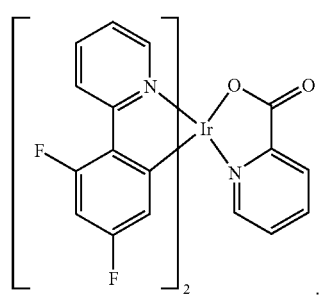
(4b)

13. The organic electroluminescent device of claim 12, wherein an energy band gap between a ground state and a singlet state of the fluorescence supporter is equal to or greater than an energy band gap between a ground state and a triplet state of the phosphorescence emission molecule.

14. The organic electroluminescent device of claim 13, wherein the energy band gap between the ground state and the singlet state of the fluorescence supporter is in the range of 2.0 to 3.5 eV, and the energy band gap between the ground state and the triplet state of the phosphorescence emission molecule is in the range of 1.9 to 3.0 eV.

15. The organic electroluminescent device of claim 12, wherein the amount of the phosphorescence emission molecule is in the range of 0.5 to 20 parts by weight based on the total weight 100 parts by weight of the host, and the amount of the fluorescence supporter is in the range of 0.5 to 50 parts by weight based on the total weight 100 parts by weight of the host.

16. The organic electroluminescent device of claim 12, wherein the fluorescence supporter is a compound represented by Formula 3:

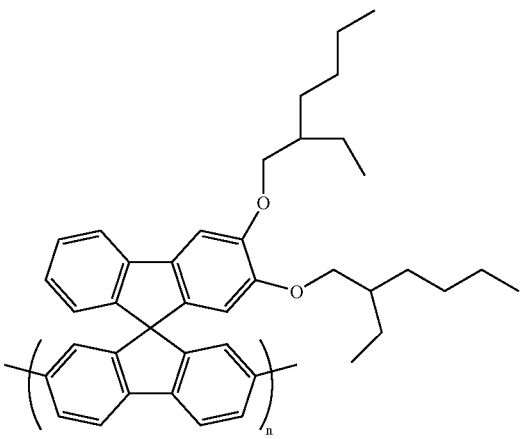
(3)

wherein n denotes the degree of polymensation and is a real number of 2 to 1,000.

17. The organic electroluminescent device of claim 12, wherein the host comprises a compound selected from the group consisting of mCP(N,N'-dicarbazolyl-3,5-benzene), poly(vinylcarbazole) (PVK), polyfluorene, CBP(4,4'-N,N'-dicarbazole-biphenyl), 4,4'-bis[9-(3,6-biphenylcarbazolyl)]-1-1,1'-biphenyl, 9,10-bis[(2',7'-t-butyl)-9',9"-spirobifluorenylanthracene, tetrafluorene, polymethacrylate, and polystyrene.

18. An organic electroluminescent device, comprising:
a pair of electrodes; and
an emission layer formed between the pair of electrodes, the emission layer comprising:
a host;
a phosphorescence emission molecule, the phosphorescence emission molecule comprising a compound selected from the group consisting of compounds represented by Formulae 4a and 4b:

(4a)

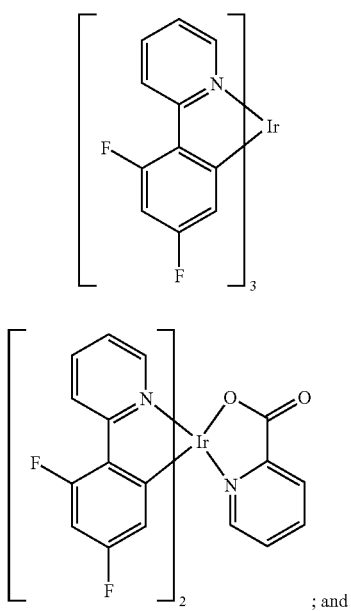

(4b)

a fluorescence supporter receiving energy from the host or trapping energy, the fluorescence support transferring the energy to the phosphorescence emission molecule and self-emitting light, the fluorescence support comprising a compound selected from the group consisting of the compounds represented by Formulae 1, 2a, 2b and 2c:

(1)

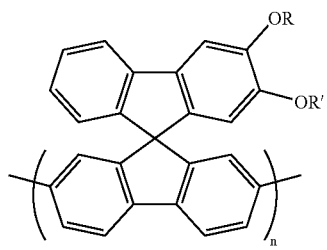

wherein n denotes the degree of polymerization and is a real number of 2 to 1,000, and R and R' are independently a $C_{1-20}$ alkyl group, (2a)

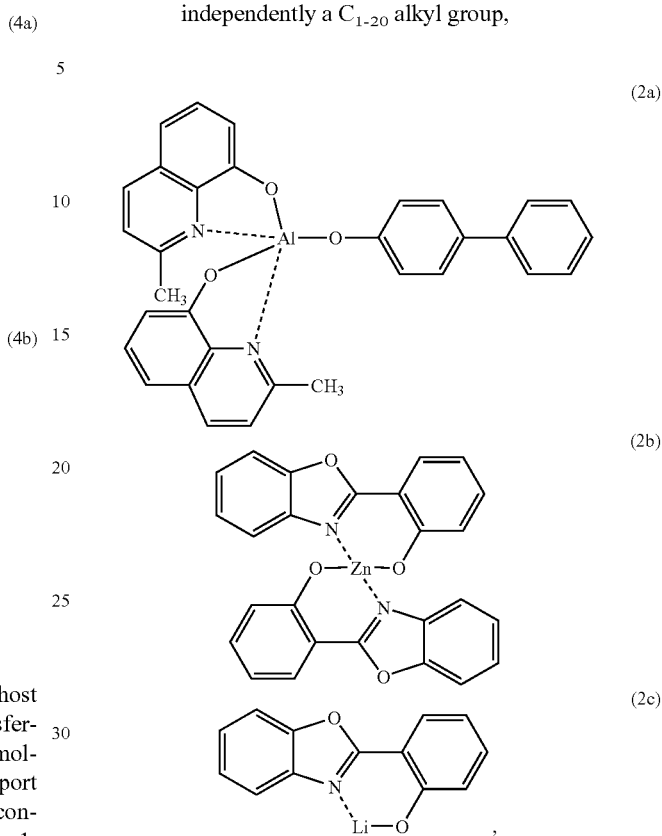

(2b)

(2c)

wherein an energy band gap between a ground state and a singlet state of the fluorescence supporter is equal to or greater than an energy band gap between a ground state and a triplet state of the phosphorescence emission molecule.

19. The organic electroluminescent device of claim 18, wherein the amount of the phosphorescence emission molecule is in the range of 0.5 to 20 parts by weight based on the total weight 100 parts by weight of the host, and the amount of the fluorescence supporter is in the range of 0.5 to 50 parts by weight based on the total weight 100 parts by weight of the host.

* * * * *